United States Patent [19]
Sharpe-Geisler

[11] Patent Number: 6,163,175
[45] Date of Patent: Dec. 19, 2000

[54] HIGH VOLTAGE DETECTOR TO CONTROL A POWER SUPPLY VOLTAGE PUMP FOR A 2.5 VOLT SEMICONDUCTOR PROCESS DEVICE

[75] Inventor: Bradley A. Sharpe-Geisler, San Jose, Calif.

[73] Assignee: Vantis Corporation, San Jose, Calif.

[21] Appl. No.: 09/276,990

[22] Filed: Mar. 26, 1999

Related U.S. Application Data

[60] Provisional application No. 60/079,674, Mar. 27, 1998.

[51] Int. Cl.[7] .................................................. H03K 5/153
[52] U.S. Cl. ............................................. 327/77; 327/66
[58] Field of Search ........................... 27/77–81, 88, 27/89, 52, 53, 65, 66, 143, 198, 103; 323/315

[56] References Cited

U.S. PATENT DOCUMENTS

| | | | |
|---|---|---|---|
| 4,749,880 | 6/1988 | Kobatake | 327/78 |
| 5,200,654 | 4/1993 | Archer | 327/66 |
| 5,512,849 | 4/1996 | Wong | 327/77 |
| 5,914,868 | 6/1999 | Han et al. | 323/315 |

*Primary Examiner*—Toan Tran
*Attorney, Agent, or Firm*—Fliesler, Dubb, Meyer & Lovejoy

[57] ABSTRACT

A high voltage detector circuit (FIG. 2) maintains a voltage ($V_2$) on a reference line driven by a charge pump by turning the charge pump on with a signal (PUMPON) when the reference line voltage ($V_2$) drops below a reference voltage ($V_1$) plus a CMOS transistor threshold voltage. The high voltage detector is further configured to use transistors which have a maximum gate to drain, or gate to source voltage which exceeds the pin supply voltage to the chip. The high voltage detector includes comparators made up of a series of current mirrors driven by weak current sources enabling the circuit to use a minimum amount of power.

11 Claims, 2 Drawing Sheets

HIGH VOLTAGE DETECTOR TO CONTROL A POWER SUPPLY VOLTAGE PUMP FOR A 2.5 VOLT SEMICONDUCTOR PROCESS DEVICE

CROSS-REFERENCE TO RELATED APPLICATION

This application claims the benefit of U.S. Provisional application Ser. No. 60/079,674, filed Mar. 27, 1998.

BACKGROUND OF THE INVENTION

1. Field of the Invention

The present invention relates to a detector for controlling a voltage pump. More particularly, the present invention relates to a high voltage detector for a voltage pump used in a circuit with low voltage process transistors, such as a circuit using 2.5 volt process transistors.

2. Description of the Related Art

FIG. 1 shows a typical circuit for a high voltage detector used to control a power supply voltage pump. The voltage pump is used to provide a voltage greater than provided by a power supply pin to a chip.

An example of an integrated circuit which might use a high voltage detector to control a voltage pump is described in U.S. patent application Ser. No. 08/912,763. The circuit described in application Ser. No. 08/912,763 includes 2.5 volt process transistors and has a power supply pin voltage ranging from 3.0–3.6 volts. For 2.5 volt process transistors, typically a maximum gate to source, or gate to drain voltage is 2.7 volts. The circuit in Applicant Ser. No. 08/912,763 also requires a voltage 1 vt greater than the pin supply voltage. Note that 1 vt is the threshold of a CMOS transistor made using the 2.5 volt semiconductor process.

The high voltage detector of FIG. 1 functions to monitor the difference between a pin voltage $V_1$ and a voltage $V_2$ on a reference line which is to be 1 vt above $V_1$. The circuit of FIG. 1 produces a signal (PUMPON) to turn on a charge pump when $V_2$ on the reference line drops from 1 vt above $V_1$.

The circuit of FIG. 1 includes an operational amplifier 100 with a +(noninverting) terminal connected through a resistor 100 to the $V_1$ supply pin. A resistor 104 connects the +opamp terminal to $V_{SS}$ or ground. The −(inverting) terminal of the opamp 100 is connected through a resistor 106 and transistor 108 having its drain and gate tied together to the $V_2$ reference line. The transistor 108 provides a 1 vt drop from $V_2$ to node n1 to create a voltage at node n1 which will be equal to $V_1$ when the $V_2$ reference line is properly charged up. Another resistor 110 connects the −opamp input to $V_{SS}$ or ground. The resistors 100, 104, 106 and 110 have an equal value R In operation, when the value on the $V_2$ reference line less 1 vt falls below $V_1$, PUMPON at the output of opamp 100 will go high to cause the voltage pump to turn on and drive the $V_2$ reference line. When the voltage pump adequately charges the $V_2$ line to 1 vt above $V_1$, the PUMPON will go low to turn off the voltage pump.

SUMMARY OF THE INVENTION

In accordance with the present invention, a high voltage detector is provided which drives a change pump to maintain a voltage ($V_2$) on a reference line above a reference voltage ($V_1$) plus a CMOS transistor threshold voltage. The high voltage detector is further configured so it may include transistors, such as 2.5 volt transistors, which have a maximum gate to drain, or gate to source voltage which can exceed the pin supply voltage to the chip.

The high voltage detector in accordance with the present invention includes a first connection to a pin supply voltage line ($V_1$) and a second connection through a transistor, similar to 108, to a ($V_2$) reference line driven by a charge pump. The high voltage detector output signal (PUMPON) controls the charge pump to assure the voltage ($V_2$) is 1 vt above the voltage ($V_1$), similar to the circuit of FIG. 1.

The voltage detector in accordance with the present invention does not use resistors as in the circuit of FIG. 1. Instead, the present invention uses a comparator made up of transistors which can be low voltage process transistors, such as 2.5 volt process devices. The comparator includes two current mirrors, a first receiving power from the ($V_1$) line, and a second receiving power from the ($V_2$) line through a transistor. The current mirrors each provide current to two current sink transistors. One current sink transistor for each current mirror receives a weak gate voltage so that the current mirror draws minimal power. The remaining current sink transistors are connected together as a current mirror, one of the transistors being buffered to provide the output of the high voltage detector.

To enable the circuit to operate with low voltage transistors, such as 2.5 volt devices, the first and second current mirrors are separated from the current sink transistors utilizing transistors having a gate connected to a voltage reference. The number of transistors separating the first and second current mirrors from the current sink transistors and the gate voltages applied to these transistors is chosen to limit the gate to source, and gate to drain voltage on any transistor in the circuit to a desired amount.

The output of the high voltage detector may be buffered through a second comparator and inverter. The second comparator includes a current mirror driving a second set of current sink transistors. The gates of the second set of current sink transistors are driven by the current sink transistors of the first comparator.

BRIEF DESCRIPTION OF THE DRAWINGS

Details of the present invention are explained with the help of the attached drawings in which.

DETAILED DESCRIPTION

Figure 1:
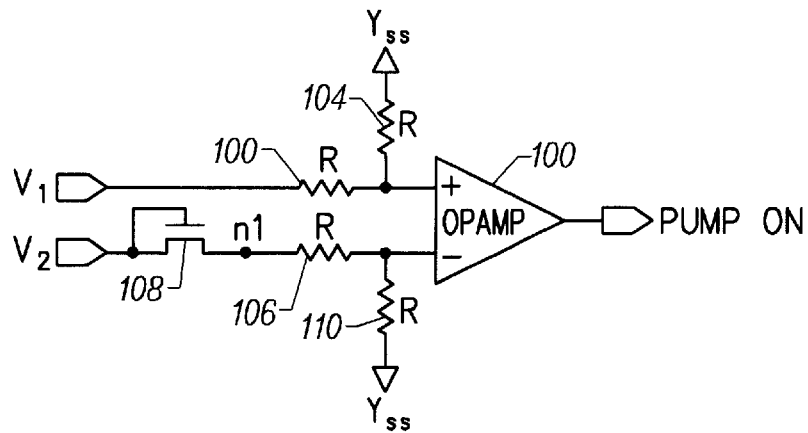
FIG. 1 illustrates typical components of a high voltage detector.
Figure 2:
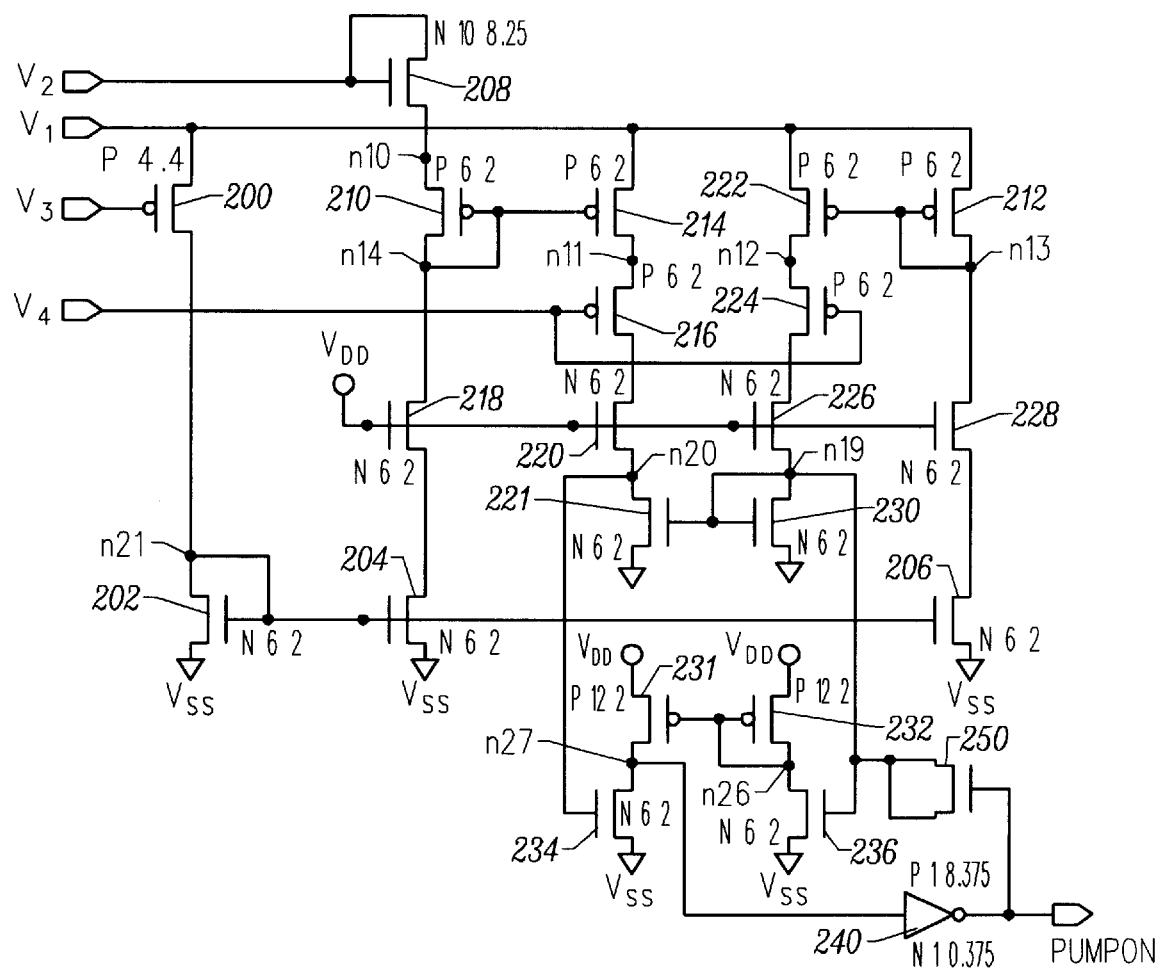
FIG. 2 shows components of a high voltage detector circuit in accordance with the present invention.

FIG. 2 shows circuitry for a high voltage detector in accordance with the present invention. The high voltage detector of FIG. 2 is connected to a $V_2$ voltage reference line and a $V_2$ voltage supply pin connection. The circuit checks to assure the voltage on the $V_2$ line is greater than 1 vt above $V_1$. The high voltage detector of FIG. 2 further receives a reference voltage $V_3$ which is 1 vt below $V_1$. The circuit further receives a reference voltage $V_4$ which is the difference between $V_{DD}$ ($V_{DD}$ being approximately 2.5 volts) and $V_1$. The high voltage detector of FIG. 2 provides an output PUMPON which is high when $V_2$ drops lower than 1 vt above $V_1$ and low when $V_2$ is higher than 1 vt above $V_1$.

When PUMPON is high, it serves to turn on a charge pump circuit to boost the value of $V_2$.

For CMOS transistors shown in FIG. 2, as well as in subsequent figures, the transistor type (p or n) is shown next to width in microns and length in microns. For the inverter 240 of FIG. 2, sizes and types for transistors making up the inventor are shown above and below the inverter. Transistor sizes shown are chosen for a 2.5 volt process technology wherein the maximum gate to source, or gate to drain voltage is on the order of 2.7 volts. A 2.5 volt device typically has a gate length of 0.25 microns or less and a gate oxide thickness of 60 Angstroms or less. Although specific transistor sizes and types are shown in FIG. 2, they are intended only to be illustrative of an embodiment of the present invention, and other transistor sizes and types may be used to satisfy specific design requirements.

In the circuit of FIG. 2, with $V_1$ set 1 vt below $V_2$, transistor 200 is only on weakly and draws minimal current. The current of transistor 200 is provided through transistor 202. Transistors 204 and 206 are connected to mirror the current through transistor 202, so transistors 204 and 206 are likewise on weakly. With the transistor sizes shown, the transistors 204 and 206 will draw around 1 microamp.

The voltage $V_2$ is connected through the gate and drain of transistor 208 so it experiences a 1 vt drop to the source of transistor 210 at node n10. The voltage $V_1$ is provided directly to the source of transistor 212. The connections at node n10, at the source of transistor 210, and at the source of transistor 212 essentially form inputs of a first comparator. For purposes of illustration, transistors on a left half of the first comparator include transistors 210, 214, 216, 218, 220, 221 and 204, while transistors on the right side include transistors 212, 222, 224, 226, 228, 230 and 206.

On the left side of the circuit transistors 210, 218 204 are connected in series. The gate of transistor 210 is tied to its drain, so it is only on weakly, similar to transistor 204, so transistors 210, 218 and 204 each draw minimal current.

Similarly, on the right side of the circuit transistors 212, 228 and 206 are connected in series. Further, the gate of transistor 212 is tied to its drain, so it is only on weakly, similar to transistor 206, so transistors 212, 228 and 206 draw minimal current. The fact that transistors 210, 218 and 204 and 212, 228 and 206 draw minimal current enables the circuit of FIG. 2 to draw significantly less power than prior art devices.

The sources of transistors 212, 222 and 214 are all tied to the $V_1$ pin connection. Transistor 222 mirrors the current provided by transistor 212 since they are connected in a current mirror configuration. Similarly, transistor 214 mirrors the current provided in transistor 210 if the voltage at node n10 is equal to the voltage at the source of 214.

Assume, however that n10 is below the voltage $V_1$, or in other words that $V_2$–1 vt is less than $V_1$. With n10 dropping, current at the drain of transistor 210 will drop and the gate voltage on transistor 214 will drop relative to the gate voltage on transistor 212. Transistor 214 will then turn on stronger than transistor 222.

For the purposes of further operation description, assume a direct connection is made from the drain of transistor 214 at node n11 to node n20 at the drain of transistor 221, and a direct connection is further made from the drain of transistor 222 at node n12 to node n19 at the drain of transistor 230. Transistors 216, 224, 220 and 226 are provided in the circuit of FIG. 2 to limit the voltage across particular transistors. Such a limited voltage is needed to prevent damage when transistors in the circuit of FIG. 2 only can sustain a minimal gate to drain, or gate to source voltage, as with 2.5 volt process transistors.

With direct connections assumed, the current in transistor 222 is provided through transistor 230, while the current in transistor 214 is provided through transistor 221. The current in transistor 230 is mirrored in transistor 221. With transistor 214 on stronger than transistor 221 due to n10 being low, and transistors 221 and 230 sinking the same current, node n20 will be pulled up significantly above node n19. A small amount of drop in n10 below $V_1$ will create a significant increase at node n20 relative to node n19 due to gain provided by the first comparator circuit.

A second comparator in FIG. 2 is made up of transistors 231, 232, 234 and 236. Node n20 is connected to the gate of transistor 234 forming a first input of the second comparator. Node n19 is connected to the gate of transistor 236 forming a second input of the second comparator. Transistor 236, thus, mirrors the current of transistor 230 which is minimal since it sinks the current through transistor 222 which is mirrored from transistor 212 which is also minimal. Likewise transistor 232 which provides current to transistor 236 is also minimal. With transistors 231 and 232 connected in a current mirror configuration, transistor 231 will mirror the minimal current of 232. Since the voltage on the gate of transistor 234 is very high with n10 being low, transistor 234 will be on strongly to pull down node n27. The PUMPON signal from inverter 240 will then go high.

Thus, the circuit of FIG. 2 uses a two stage comparator. The circuit could use only the first comparator with two inverters connecting an output at node n20 to PUMPON, however, the additional inverter will draw more power than the second comparator circuit shown in FIG. 2.

Once the pump turns on enough to pull $V_2$ substantially equal to 1 vt above $V_1$, the voltage at node n20 will drop to a level below the threshold of inverter 240 and PUMPON will return to a low state. The circuit will then continue drawing only limited power depending on the voltage applied to the gates of transistors 204 and 206.

Overvoltage Protection

If node n11 at the drain of transistor 214 is at $V_1$, and $V_4$ at the gate of transistors 216 and 224 is set to 2.5 volts below $V_1$, the voltage drop across transistor 216 will not exceed 2.5 volts. The gate of transistor 216 limits the voltage drop from node n11 to node n15. Transistor 220 has $V_{DD}$ applied to its gate, so the most node n20 will reach will be $V_{DD}$–1 vt, or approximately 1.8 volts with transistor 214 on strong to deliver $V_2$ at 3.3 volts. With node n20 at 1.8 volts, the voltage across transistor 221 will not exceed a 2.7 volt maximum. Further with a drop from 3.3 volts at $V_1$ to 1.8 volts at n20, amounting to approximately 2.5 volts, and transistor 216 providing a maximum 2.5 volt drop, the maximum drop across transistor 214 will be significantly less than a 2.7 volt maximum for 2.5 volt devices. Therefore, none of transistors 214, 216, 220 and 221 will be stressed. Similar protection is provided on the right side of the first comparator.

Similar protection is provided using transistor 218. Node n14 is always 1 vt below n10 with the gate and drain of transistor 210 tied together. With the voltage at node n10 approximately at $V_1$ or less, and $V_1$ ranging as high as 3.6 volts, 1 vt below $V_1$ can still be above 2.5 volts. With the gate of transistor 218 at 2.5 volts, it will pass 2.5 volts minus 1 vt, or 1.8 volts from its source to drain. With a 1.8 volt drop across transistor 218, the maximum drop across transistor 210 will then be 3.6–1.8=1.8 volts. Transistor 210 will, thus, not exceed a maximum voltage requirement for a 2.5 volt device. Similar protection is provided by transistor 228 for transistor 212 on the right side of the first comparator.

Note that no intermediate transistor is provided between transistors 200 and 202. However, the voltage at node n21 is at 1 vt with the drain and gate of transistor 202 tied together. The gate of transistor 200 is set at $V_3$ which is approximately 1 vt below $V_1$. Therefore $V_1$–2 vt will be the source to drain voltage across transistor 200. With 1 vt at approximately 0.6 volts minimum, the source to drain voltage of transistor 200 will be 2.4 volts worst case with $V_1$ at 3.6 volts. Transistor 200 will, therefore, not exceed maximum voltage requirements for a 2.5 volt device.

A transistor 250 is connected in a capacitor configuration with its source and drain connected to node n19 and its gate connected to the output of the inverter. Transistor 250 provides negative feedback to prevent charge pump overshoot due to the slow response of the comparator circuit.

Circuit To Generate $V_4$

Figure 3:
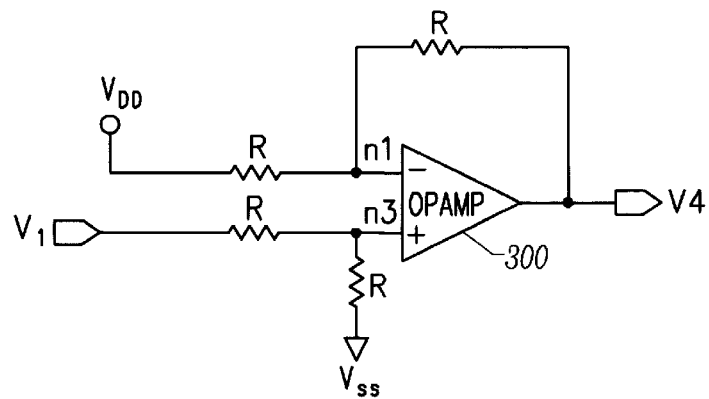
FIG. 3 shows components of a circuit to generate the reference voltage $V_3$ used in FIG. 2.

FIG. 3 shows circuitry for providing the voltage $V_4$ for the present invention. The circuit is designed to form a subtractor and subtracts $V_{DD}$ (2.5 volts) from $V_1$. The difference is generated relative to ground or $V_{SS}$. With the opamp 300 it is assumed that n1=n3 and minimal current is withdrawn by the opamp 300 from nodes n1 and n3. As such we can solve for $V_4$ as follows:

n3=$V_1$/2 n1=$V_4$+($V_{DD}$-$V_4$)/2

$V_1$/2=$V_4$+($V_{DD}$-$V_4$)/2

$V_1$=$V_4$+$V_{DD}$ $V_4$=$V_1$-$V_{DD}$.

Circuit For OPAMP

Figure 4:
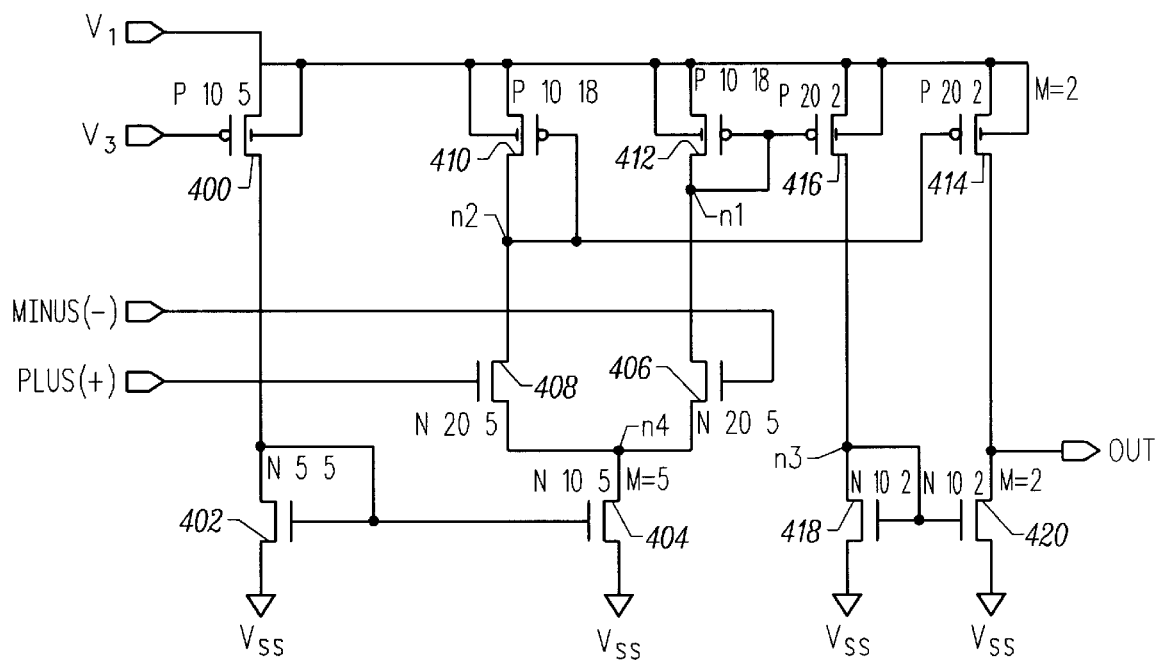
FIG. 4 shows components of an opamp used in the circuit of FIG. 3.

FIG. 4 shows circuitry for an opamp 300 of FIG. 3 as configured to use low voltage transistors, such as 2.5 volt process transistors. As with FIG. 2, transistor type followed by channel length and width are identified with each transistor. The indication M=2 and M=5 indicates either 2 or 5 transistors with the designated type and dimensions are connected in parallel.

PMOS transistor 400 of the opamp has a source tied to $V_1$, and a gate connected to $V_3$. Transistor 400 will, thus, be a weak current source with $V_1$ and $V_3$ having voltage values as described above. NMOS Transistor 402 has a drain and gate connected to the drain of transistor 400, and a source connected to ground. Transistor 402 will sink the same current as transistor 400 and will likewise be weakly turned on with a 1 vt gate voltage.

Transistor 404 has a gate connected to the gate of transistor 402. Transistor 404 will, thus, mirror the current drawn by transistor 402, but transistor 404 is 20 times larger and will draw 20 times more current (m=5 indicates 5 transistors with a width of 10 microns for transistor 404, while transistor 402 has an 5 micron width).

NMOS transistors 406 and 408 have gates receiving the differential input for the opamp. Transistor 406 receives the inverting (−) input, and transistor 408 receives the noninverting (+) input. Transistors 406 and 406 have sources connected to the drain of transistor 404.

Transistor 410 has a gate and drain connected to the drain of transistor 408, so transistor 410 is biased by current from transistor 408. For example, if transistor 408 is drawing 10 microamps, transistor 410 which has a source connected to $V_1$ will source 10 microamps. Similarly, transistor 412 has a gate and drain connected to the drain of transistor 406, and a source connected to $V_1$, so transistor 412 will source the same current which transistor 406 sinks.

In operation, we first assume that the noninverting (+) input of the opamp in FIG. 4 is higher than the inverting (−) input. Node n4 will go to the threshold of an NMOS transistor (1 Vt) below the +input and all current to transistor 404 will be provided by transistor 408. Transistor 406 will turn off. Similarly, if the input is above the +input, transistor 408 will be off and transistor 406 will conduct to pull node n4 1 Vt below the −input. For example, if the +input is 2.2 volts and the −input is 2.0 volts, transistor 408 will turn on to pull node n4 to 2.2 volts minus 1 Vt and transistor 406 will be turned off. If the −input is 2.2 volts, and +input is 2.0 volts, transistor 406 will turn on to pull node n4 to 2.2 volts minus 1 Vt and transistor 408 will turn off.

Transistor 414 has a gate connected to the gate of transistor 410 and a source connected to $V_1$ to form a current mirror. Similarly, transistor 416 has a gate connected to the gate of transistor 412 and a source connected to $V_1$ to form another current mirror. An additional current mirror is formed by transistors 418 and 420 which have gates connected together. Transistor 418 further has its gate and drain connected to the drain of transistor 416. The drain of transistor 420 is connected to the drain of transistor 414 to form the output (OUT) of the opamp. Sources of transistors 418 and 420 are connected to ground.

Assuming that the +input is above the −input, transistor 408 will be on and transistor 404 will sink current from transistor 410, while transistor 406 is off and transistor 412 has no path to ground. With no current through transistor 412, transistor 416 which mirrors the current of transistor 412, will provide no current. Since transistor 418 sinks the current transistor 416 sources, transistor 418 will carry no current. Since transistor 420 mirrors the current transistor 418 sinks, transistor 420 will sink no current. A path to ground from the output (OUT) will, thus, be cut off. With transistor 414 mirroring the current of transistor 410 and transistor 420 turned off, the output (OUT) will be pulled up to $V_1$. Transistor 414 is sized approximately 40 times larger than transistor 410, so significant gain will be provided to assure the output (OUT) is high.

Similarly, if the −input is above the +input, transistor 406 will be on and transistor 404 will sink current from transistor 412, while transistor 408 will be off along with transistor 410. With transistor 410 off, transistor 414 will not source current to the output (OUT). With transistor 412 on, transistor 416 mirroring current from transistor 412, transistor 418 sinking the current sourced by transistor 412, and transistor 420 mirroring the current of transistor 418, transistor 420 will pull the output (OUT) to ground. Transistor 420 is significantly larger than transistor 418 and will sink a significant amount of current when transistor 418 is turned on to assure the output (OUT) is pulled down.

In summary, a small difference between the −input and the +input will cause a switching of the voltage on the output (OUT). If the −input and the +input are substantially equal, then the output (OUT) will be theoretically balanced.

The circuit of FIG. 4 is configured so that with 2.5 volt semiconductor process transistors, the gate to source and gate to drain voltages for the opamp transistors will not exceed a maximum of 2.7 volts. The voltage applied to the +and −inputs will preferably be 1.2 volts, and node n4 will be 1 vt below this or around 0.6 volts. Node n2 will be $V_1$−1 vt since transistor 410 has its drain and gate connected together. With $V_1$ being a maximum of 3.6 volts, node n2 will be around 3.0 volts. With node n4 being around 0.6 volts, a maximum of 2.4 volts will be applied across transistors 406 and 408. Node n3 is 1 Vt since transistor 418 has its gate and drain connected. The gate of transistor 416 being tied to the gate of transistor 412 will also be 1 Vt below $V_1$. The highest gate stress of transistor 416 will then be $V_1$−1 Vt−1 Vt, or around 2.4 volts. The same conditions exist for transistor 414.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A voltage detector circuit comprising:
    a first transistor (208) having a source to drain path coupling a first voltage potential ($V_2$) line to a first node (n10);
    a first current mirror comprising:
        a first transistor (210) having a source to drain path coupled on a first end to the first node (n10) and on a second end to a third node (n14), and having a gate coupled to the third node (n14); and
        a second transistor (214) having a source to drain path coupled on a first end to a second voltage potential ($V_1$) line and on a second end to a fourth node (n11), and having a gate coupled to the gate of the first transistor (210) of the first current mirror;
    a second current mirror comprising:
        a first transistor (212) having a source to drain path coupled on a first end to the second voltage potential ($V_1$) line and on a second end to a fifth node (n13), and having a gate coupled to the fifth node (n13); and
        a second transistor (222) having a source to drain path coupled on a first end to the second voltage potential ($V_1$) line and on a second end to a sixth node (n12), and having a gate coupled to the gate of the first transistor (212) of the second current mirror;
    a second transistor (204) having a source to drain path coupling the third node (n14) to $V_{SS}$, and having a gate receiving a voltage reference;
    a third transistor (206) having a source to drain path coupling the fifth node (n13) to $V_{SS}$, and having a gate receiving a voltage reference; and
    a third current mirror comprising:
        a first transistor (230) having a source to drain path with a first end coupled to the sixth node (n12) and a second end coupled to $V_{SS}$, and having a gate coupled to the first end of its source to drain path; and
        a second transistor (221) having a source to drain path with a first end coupled to the fourth node (nil) and a second end coupled to $V_{SS}$, and having a gate coupled to the gate of the first transistor (230) of the fourth current mirror, the first end of the source to drain path of the second transistor (221) for providing an output signal for the voltage detector circuit indicating if a voltage potential at the first node (n10) is greater or less than the second voltage potential ($V_1$) on the second voltage potential line.

2. The voltage detector of claim 1, further comprising:
    a fourth transistor (200) having a source to drain path coupling the second voltage potential ($V_1$) line to a second node (n21), and having a gate connected to a third voltage potential ($V_3$) line; and
    a fifth transistor (202) having a source to drain path coupling the second node (n21) to $V_{SS}$, and having a gate coupled to the second node (n21) and to the gates of the second transistor (204) and third transistor (206) to provide the voltage reference.

3. The voltage detector of claim 1 further comprising:
    a first voltage control transistor (228) having a source to drain path coupling the source to drain path of the third transistor (206) of the third current mirror to the fifth node (n13) and having a gate coupled to $V_{DD}$;
    a second voltage control transistor (218) having a source to drain path coupling the source to drain path of the second transistor (204) of the third current mirror to the second node (n14) and having a gate coupled to $V_{DD}$;
    a third voltage control transistor (220) having a source to drain path coupling the source to drain path of the second transistor (221) of the fourth current mirror to the fourth node (n11), and having a gate coupled to $V_{DD}$; and
    a fourth voltage control transistor (226) having a source to drain path coupling the source to drain path of the first transistor (230) of the fourth current mirror to the sixth node (n12), and having a gate coupled to $V_{DD}$.

4. The voltage detector of claim 3 further comprising:
    a fifth voltage control transistor (216) having a source to drain path coupling the source to drain path of the third voltage control transistor (220) to the fourth node (nil), and having a gate coupled to a fourth voltage potential ($V_4$) line; and
    a sixth voltage control transistor (224) having a source to drain path coupling the source to drain path of the fourth voltage control transistor (226) to the sixth node (n12), and having a gate coupled to the fourth voltage potential ($V_4$) line.

5. The voltage detector of claim 1 further comprising:
    two series connected inverters connected to the first end of the source to drain path of the second transistor (221) of the third current mirror to provide buffering of the output signal for the voltage detector circuit.

6. The voltage detector of claim 1 further comprising a comparator and inverter (240) to provide buffering of the output signal for the voltage detector circuit, the comparator comprising:
    a first current sink transistor (234) having a source to drain with a first end coupled to an input of the inverter (240) and a second end coupled to $V_{SS}$, and having a gate coupled to the first end of the source to drain path of the second transistor (221) of the third current mirror;
    a second current sink transistor (236) having a source to drain path with a first end coupled to $V_{SS}$, and having a gate coupled to the first end of the source to drain path of the first transistor (230) of the third current mirror; and
    a current mirror comprising:
        a first transistor (232) having a source to drain path coupling $V_{DD}$ to a second end of the source to drain path of the second current sink transistor (236), and having a gate coupled to the second end of the source to drain path of the second current sink transistor (236); and
        a second transistor (231) having a source to drain path coupling $V_{DD}$ to the input of the inverter (240), and having a gate coupled to the second end of the source to drain path of the second current sink transistor (236).

7. The voltage detector circuit of claim 1, wherein the first transistor (208) has a gate coupled to the first voltage potential ($V_2$) line.

8. A voltage detector circuit comprising:
    a first NMOS transistor (208) having a source to drain path coupling a first voltage potential ($V_2$) line to a first node (n10);
    a first PMOS transistor (200) having a source to drain path coupling a second voltage potential ($V_1$) line to a second node (n21), and having a gate connected to a third voltage potential ($V_3$) line;

a first current mirror comprising:

a first PMOS transistor (210) having a source to drain path coupled on a first end to the first node (n10) and on a second end to a third node (n14), and having a gate coupled to the third node (n14); and a second PMOS transistor (214) having a source to drain path coupled on a first end to the second voltage potential ($V_1$) line and on a second end to a fourth node (n11), and having a gate coupled to the gate of the first PMOS transistor (210) of the first current mirror;

a second current mirror comprising:

a first PMOS transistor (212) having a source to drain path coupled on a first end to the second voltage potential ($V_1$) line and on a second end to a fifth node (n13), and having a gate coupled to the fifth node (n13); and a second PMOS transistor (222) having a source to drain path coupled on a first end to the second voltage potential ($V_1$) line and on a second end to a sixth node (n12), and having a gate coupled to the gate of the first PMOS transistor (212) of the second current mirror;

a third current mirror comprising:

a first NMOS transistor (202) having a source to drain path coupling the second node (n21) to $V_{SS}$, and having a gate coupled to the second node (n21);

a second NMOS transistor (204) having a source to drain path coupling the third node (n14) to $V_{SS}$, and having a gate coupled to the second node (n21); and a third NMOS transistor (206) having a source to drain path coupling the fifth node (n13) to $V_{SS}$, and having a gate coupled to the second node (n21); and a fourth current mirror comprising:

a first PMOS transistor (230) having a source to drain path with a first end coupled to the sixth node (n12) and a second end coupled to $V_{SS}$, and having a gate coupled to the first end of its source to drain path; and a second PMOS transistor (221) having a source to drain path with a first end coupled to the fourth node (nil) and a second end coupled to $V_{SS}$, and having a gate coupled to the gate of the first PMOS transistor (230) of the fourth current mirror, the first end of the source to drain path of the second PMOS transistor (221) for providing an output signal for the voltage detector circuit indicating if a voltage potential at the first node (n10) is greater or less than the second voltage potential ($V_1$) on the second voltage potential line.

9. The voltage detector of claim 8 further comprising:

a first NMOS voltage control transistor (228) having a source to drain path coupling the source to drain path of the third NMOS transistor (206) of the third current mirror to the fifth node (n13) and having a gate coupled to $V_{DD}$;

a second NMOS voltage control transistor (218) having a source to drain path coupling the source to drain path of the second NMOS transistor (204) of the third current mirror to the second node (n14) and having a gate coupled to $V_{DD}$;

a third NMOS voltage control transistor (220) having a source to drain path coupling the source to drain path of the second NMOS transistor (221) of the fourth current mirror at a seventh node (n20) to the fourth node (n11), and having a gate coupled to $V_{DD}$; and a fourth NMOS voltage control transistor (226) having a source to drain path coupling the source to drain path of the first NMOS transistor (230) of the fourth current mirror at an eighth node (n19) to the sixth node (n12), and having a gate coupled to $V_{DD}$.

10. The voltage detector of claim 9 further comprising:

a first PMOS voltage control transistor (216) having a source to drain path coupling the source to drain path of the third NMOS voltage control transistor (220) to the fourth node (n11), and having a gate coupled to a fourth voltage potential ($V_4$) line; and a second PMOS voltage control transistor (224) having a source to drain path coupling the source to drain path of the fourth NMOS voltage control transistor (226) to the sixth node (n12), and having a gate coupled to the fourth voltage potential ($V_4$) line.

11. The voltage detector of claim 9 further comprising:

an inverter (240);

a first NMOS current sink transistor (234) having a source to drain with a first end coupled to an input of the inverter (240) and a second end coupled to $V_{SS}$, and having a gate coupled to the seventh node (n20);

a second NMOS current sink transistor (236) having a source to drain path with a first end coupled to $V_{SS}$, and having a gate coupled to the eighth node (n19); and a fifth current mirror comprising:

a first PMOS transistor (232) having a source to drain path coupling $V_{DD}$ to a second end of the source to drain path of the second NMOS current sink transistor (236), and having a gate coupled to the second end of the source to drain path of the second NMOS current sink transistor (236); and a second PMOS transistor (231) having a source to drain path coupling $V_{DD}$ to the input of the inverter (240), and having a gate coupled to the second end of the source to drain path of the second NMOS current sink transistor (236).

* * * * *

UNITED STATES PATENT AND TRADEMARK OFFICE
CERTIFICATE OF CORRECTION

PATENT NO. : 6,163,175
DATED : December 19, 2000
INVENTOR(S) : Sharpe-Geisler

Page 1 of 1

It is certified that error appears in the above-identified patent and that said Letters Patent is hereby corrected as shown below:

Column 1, claim 1,
Line 46, delete "(nil)" and insert -- (n11) --.

Column 8, claim 4,
Line 19, delete "(nil)" and insert -- (n11) --.

Column 9, claim 7,
Line 45, delete "(nil)" and insert -- (n11) --.

Signed and Sealed this

Twentieth Day of November, 2001

Attest:

*Nicholas P. Godici*

NICHOLAS P. GODICI
*Attesting Officer*    *Acting Director of the United States Patent and Trademark Office*